United States Patent [19]

Itomi

[11] Patent Number: 5,162,889
[45] Date of Patent: Nov. 10, 1992

[54] STATIC RANDOM ACCESS MEMORY CELL

[75] Inventor: Noboru Itomi, Suwa, Japan

[73] Assignee: Seiko Epson Corp., Tokyo, Japan

[21] Appl. No.: 608,144

[22] Filed: Nov. 1, 1990

[30] Foreign Application Priority Data

Nov. 2, 1989 [JP] Japan .................................. 1-286505
Nov. 2, 1989 [JP] Japan .................................. 1-286506
Nov. 2, 1989 [JP] Japan .................................. 1-286507
Nov. 2, 1989 [JP] Japan .................................. 1-286508

[51] Int. Cl.$^5$ .................. H01L 27/02; H01L 27/13; H01L 29/04; G11C 11/00
[52] U.S. Cl. ........................ 257/69; 365/154; 257/903
[58] Field of Search ............ 357/42, 23.7, 59 E; 365/154

Primary Examiner—Rolf Hille
Assistant Examiner—Robert Limanek

[57] ABSTRACT

A semiconductor IC having static memory cells comprised of a first pair of MIS transistors with channels fabricated on a surface of a semiconductor substrate, and a second and third pair of MIS transistors with channels fabricated on a layer of semiconductor thin film that is on top of a insulating layer, the third pair of MIS transistors are fabricated on top of the second pair of MIS transistors through a first insulating layer such that a portion of the thickness of the first insulating layer which makes contact with the channels of the second or third pair of MIS transistors is thicker than the gate insulating of the second and third pair of MIS transistors, and has a metal interconnect for a pair of bit lines which are fabricated on the third pair of MIS transistors through a second insulating layer as well as that part of the thickness of the second insulating layer that makes contact with channels of the third pair of MIS transistors and is thicker than the gate insulating of the third pair of MIS transistors.

26 Claims, 4 Drawing Sheets

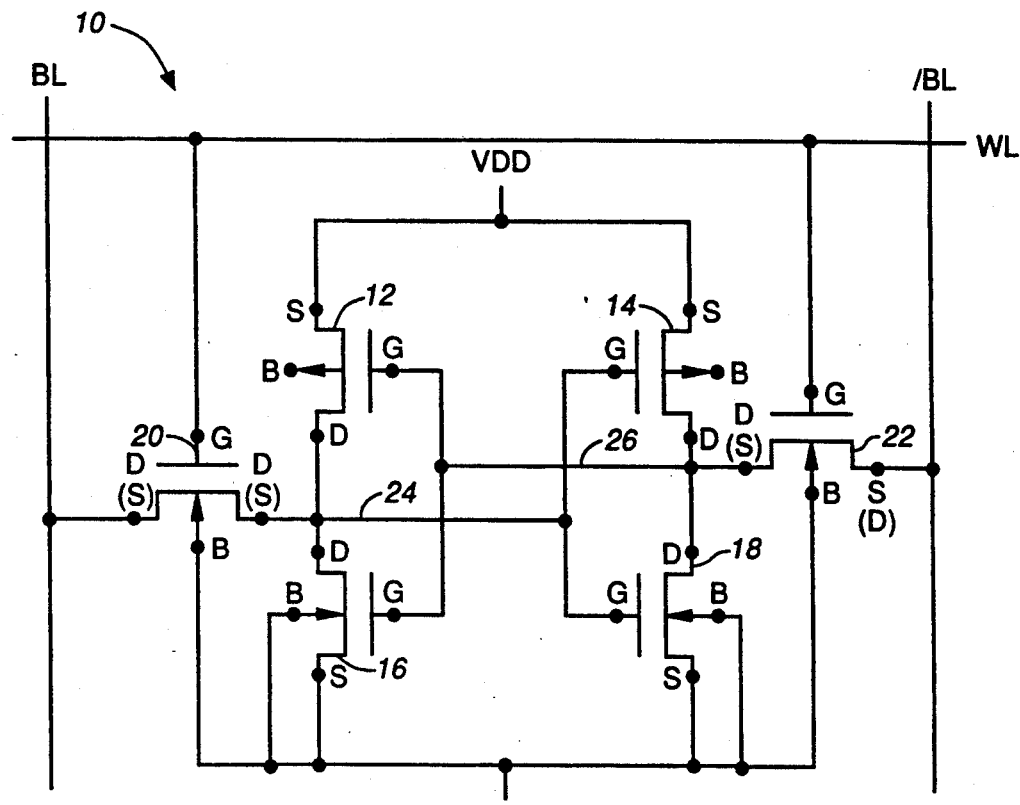
FIG._1
(PRIOR ART)
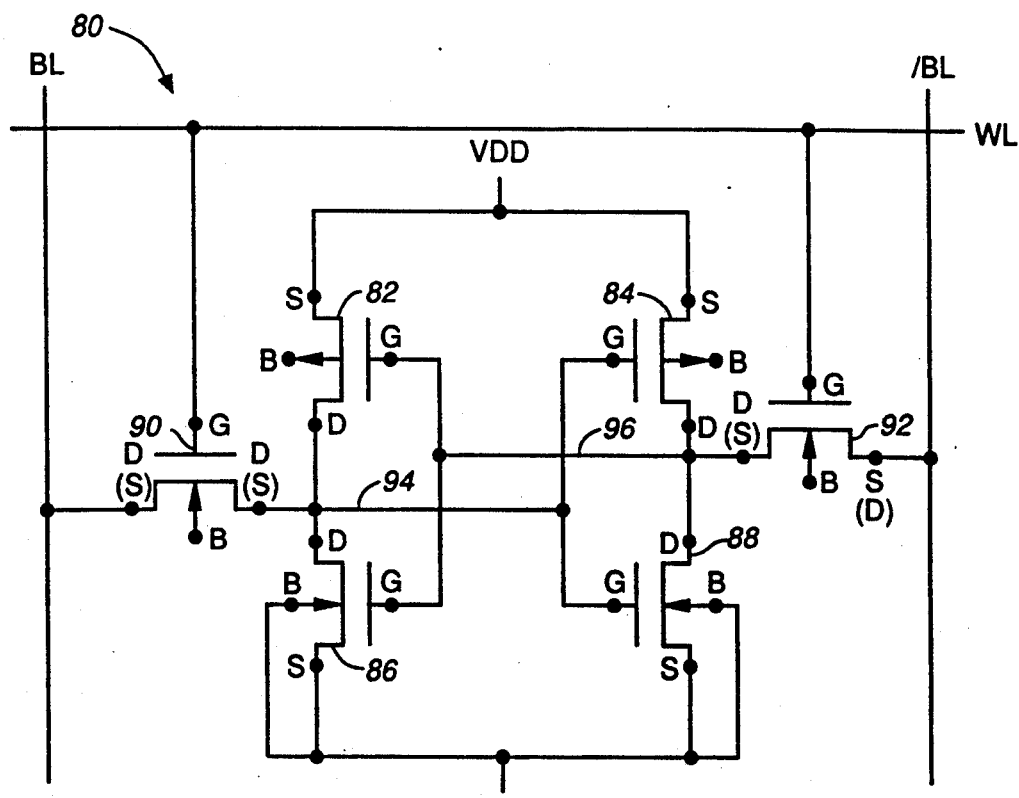
FIG._4

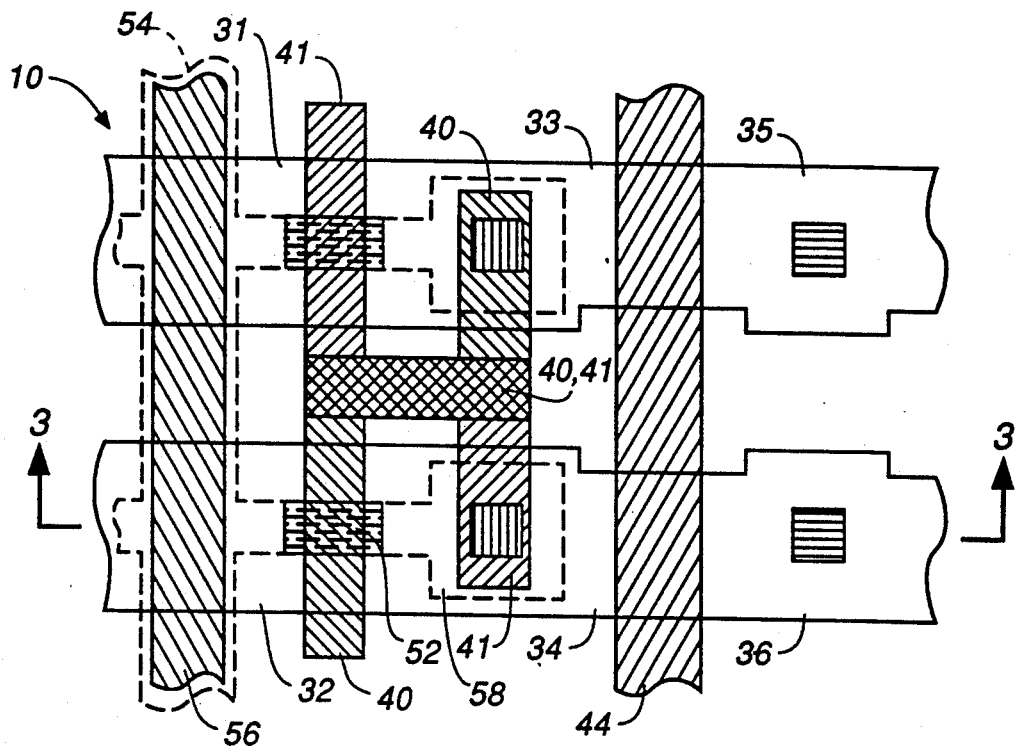
FIG._2
(PRIOR ART)
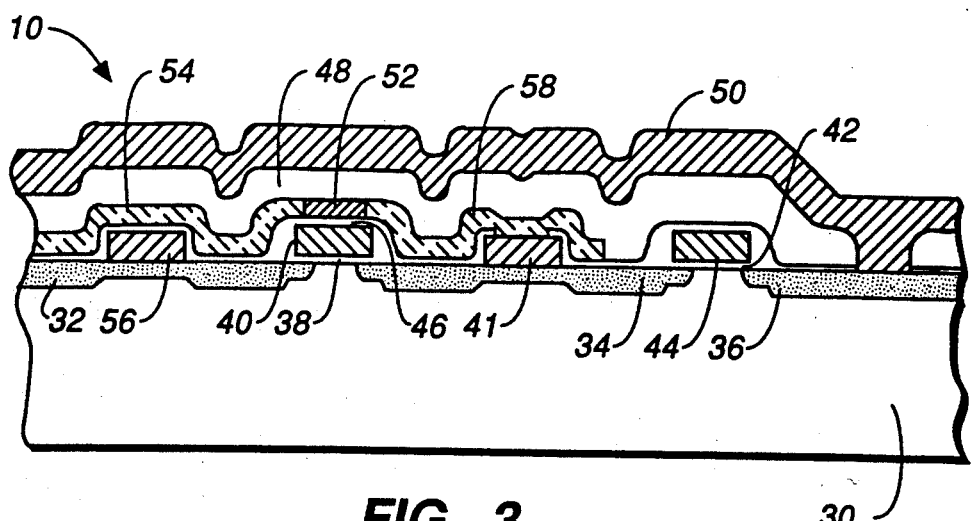
FIG._3
(PRIOR ART)

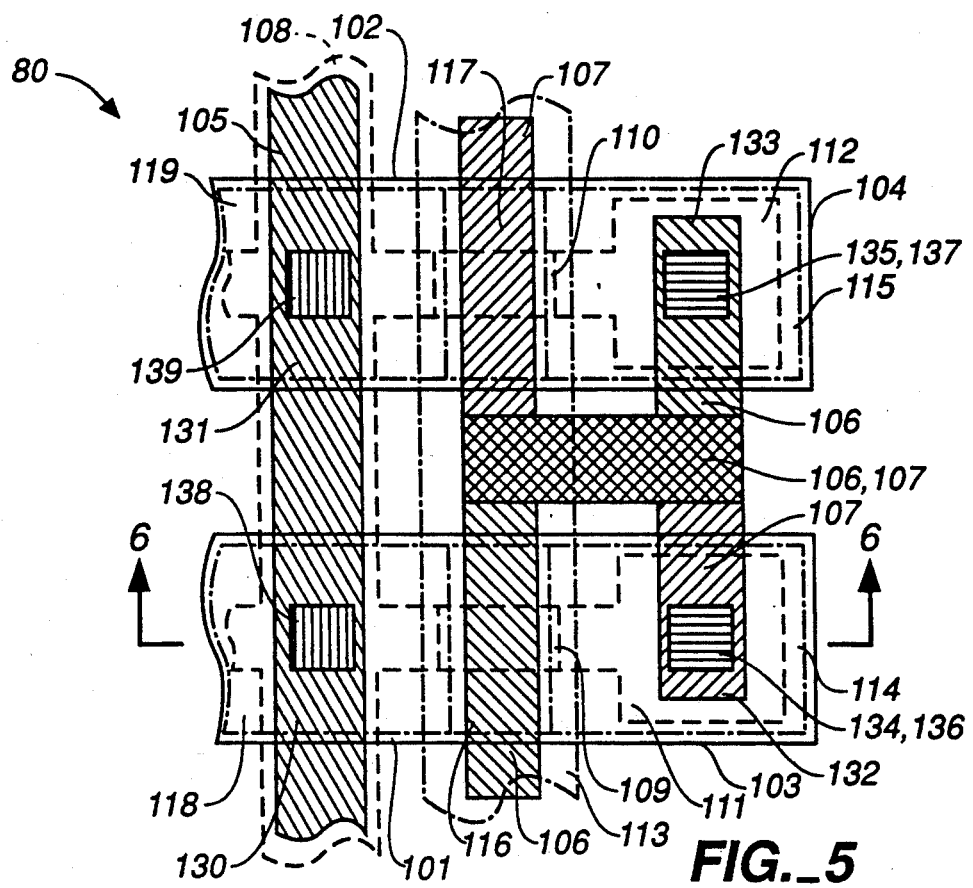
FIG._5
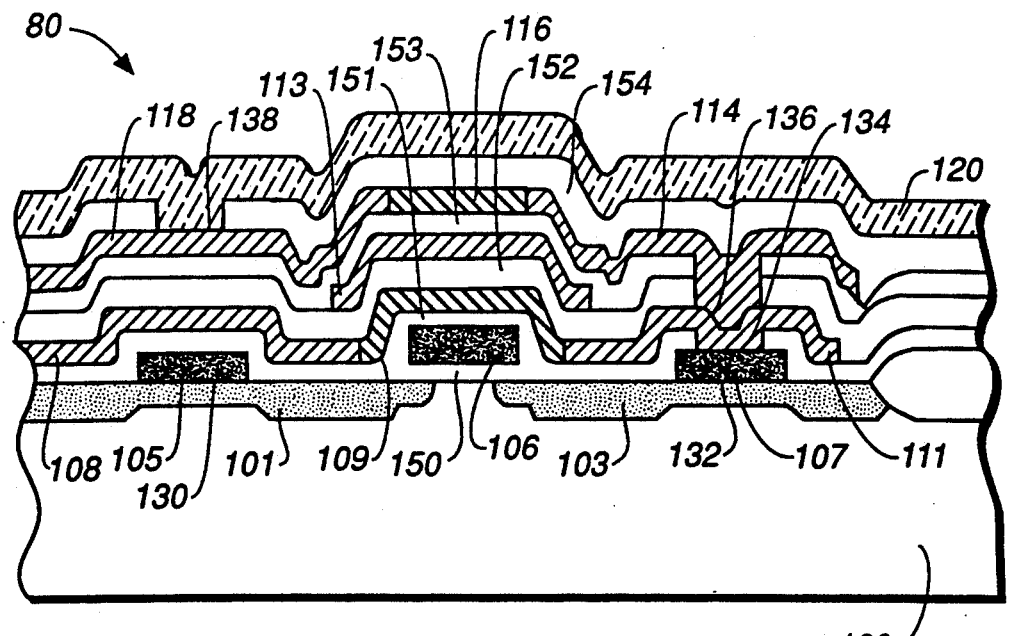
FIG._6

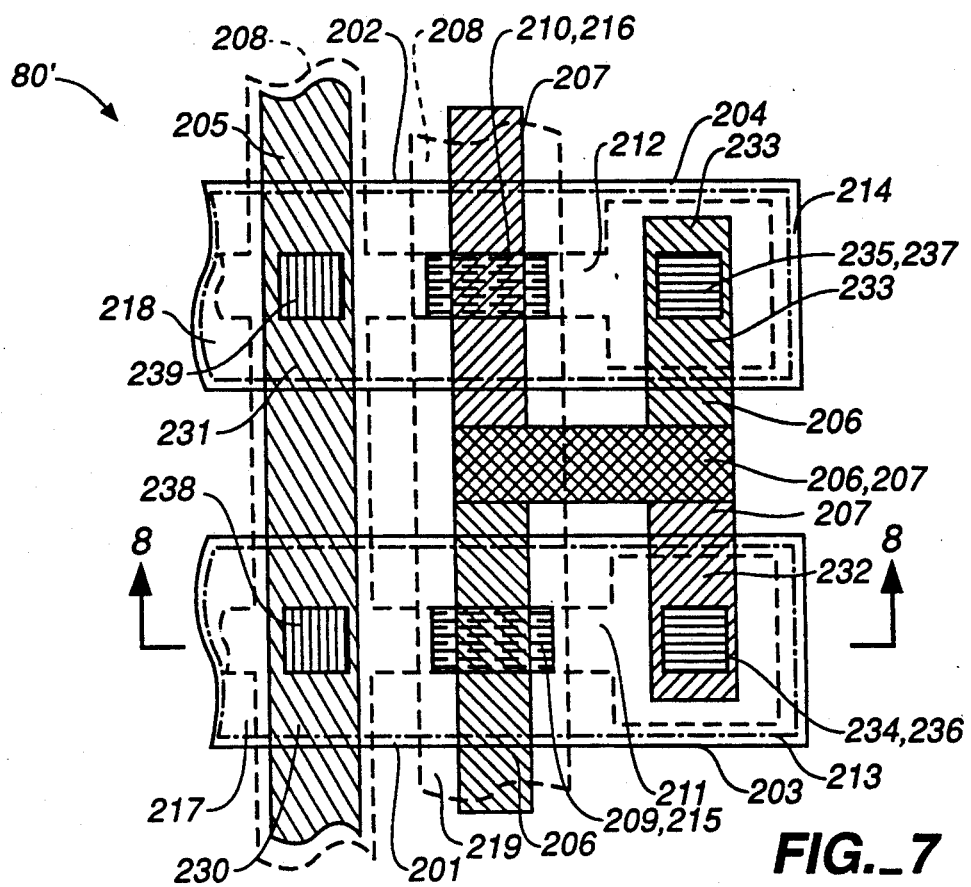
FIG._7
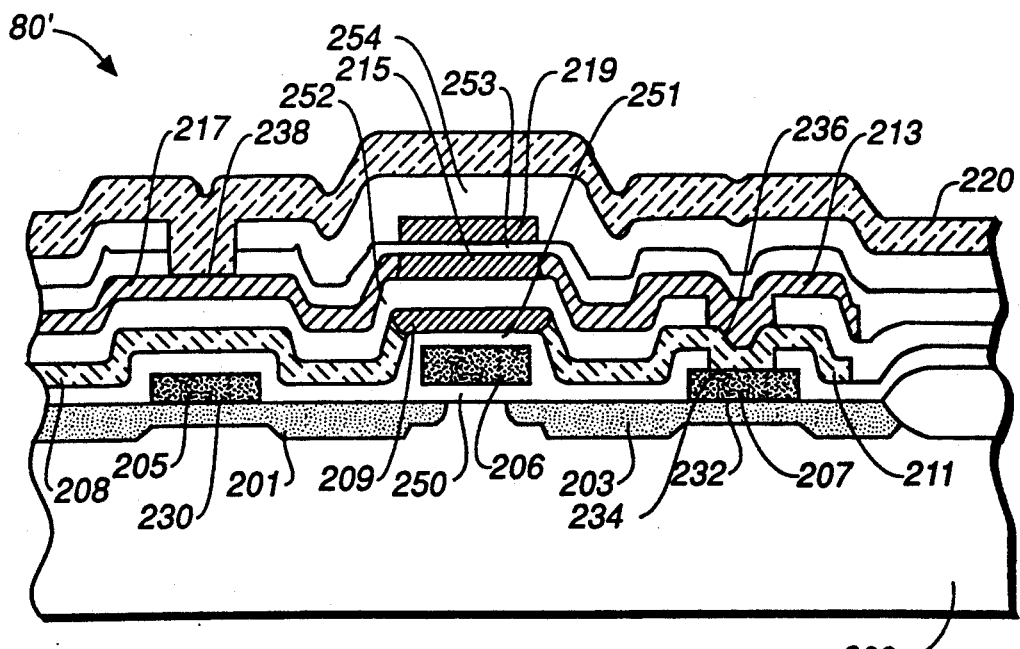
FIG._8

STATIC RANDOM ACCESS MEMORY CELL

BACKGROUND OF THE INVENTION

The present invention relates generally to metal insulator semiconductor (MIS) transistors (also known as metal-oxide-semiconductor (MIS)), and specifically to static random access memory (SRAM) cells employing MIS transistors in bistable flip-flop circuits to implement basic SRAM memory cells.

FIG. 1 illustrates a common prior art flip-flop circuit 10 constructed of a plurality of MIS transistors 12, 14, 16, 18, 20, and 22. Transistors 12 and 16 form a pull-up/pull-down pair cross-connected with another pair, transistors 14 and 18. The cross-connection makes circuit 10 bistable. Such a configuration is called a flip-flop. Transistors 20 and 22 are enabled by word line (WL). When WL is high, bit line (BL) and bit line not (/BL, [the "/" signifies inversion]) are coupled through respectively by transistors 20 and 22. If a signal point 24 is low, a signal point 26 will be high, and vice versa. Similarly if BL is high, then /BL will be low, and vice versa. If BL matches the state of point 24 when WL goes high, circuit 10 will not flip-flop. But if BL is the opposite of the state of point 24 when WL goes high, circuit 10 will flip-flop. (The same is true for /BL and point 26.) Circuit 10 is used as the basic memory cell in static random access memories (SRAMs). Note, however, that the body terminal of all the N channel type MIS transistors (16, 18, 20, and 22) are connected to $V_{ss}$ (ground).

FIGS. 2 and 3 illustrate the process and fabrication used in the prior art to construct circuit 10. For the sake of clarity, only one cross-section through transistors 12, 16, and 20 is discussed. Transistors 14, 18, and 22 are similarly fabricated, except to the extent that the interconnect of the schematic of FIG. 1 must be satisfied. A P-type substrate 30 has a group of N+ regions 32, 34, and 36 that form various parts of transistors 16, 18, and 20. A gate insulating layer 38 insulates the gate of transistor 16 from a first layer of N+ polycrystalline silicon layer 40 acting as a gate electrode. A gate insulating layer 42 insulates the gate of transistor 20 from a second layer of N+ polycrystalline silicon layer 44 acting as a gate electrode. The body, or substrate for both transistors 16 and 20 are, of course, common to both and connected to Vss. A gate insulating layer 46 insulates the gate of transistor 12. Layer 40 also serves as a gate electrode for transistor 12. The source and drain of transistor 12 are formed by a third layer of P+ polycrystalline silicon film 58 and a P+ polycrystalline silicon film 54, respectively, with a N− polycrystalline silicon film 52 acting as the channel. An insulating layer 48 insulates an aluminum interconnect layer 50. The source and drain of transistor 16 are formed by regions 32 and 34, respectively, with the substrate 30 acting as the channel. The source or drain and drain or source of transistor 20 are formed by regions 34 and 36, respectively, with the substrate 30 acting as the channel. (Note that the channels of transistors 16 and 20 are the same substrate 30.) Transistor 20 consumes chip real estate, versus transistor 12, which does not, because it is fabricated above transistor 16 and each has a common gate electrode. The $V_{ss}$ interconnects are made by a second layer of N+ polycrystalline silicon layer 56 and $V_{dd}$ interconnects are made by a third layer of P+ polycrystalline silicon layer 54.

A principal concern in fabricating circuit 10 is to keep its geometries small so that very dense memories can be fabricated on a single chip. But the small geometries mean reduced MIS transistor channel dimensions, and that reduces the transistors' beta (gain). Reduced betas will lead to instability and poor bistable performance.

SUMMARY OF THE INVENTION

According to the present invention, a SRAM memory cell comprises a bistable flip-flop having a pair of MIS inverters cross-connected to each other. A pair of MIS transistors are used to transfer data in and out, and they have their body (substrate) terminals isolated from the bodies of the transistors comprising the two inverters. These transfer transistors are fabricated on top of the other transistors, which means no addition chip real estate is required beyond that necessary for the cross-connected inverters. In a preferred embodiment a semiconductor IC is made of static memory cells comprised of a first pair of MIS transistors with channels fabricated on a surface of a semiconductor substrate, and a second and third pair of MIS transistors with channels fabricated on a layer of semiconductor thin film that is on top of a insulating layer, the third pair of MIS transistors are fabricated on top of the second pair of MIS transistors through a first insulating layer such that a portion of the thickness of the first insulating layer which makes contact with the channels of the second or third pair of MIS transistors is thicker than the gate insulating of the second and third pair of MIS transistors, and has a metal interconnect for a pair of bit lines which are fabricated on the third pair of MIS transistors through a second insulating layer as well as that part of the thickness of the second insulating layer that makes contact with channels of the third pair of MIS transistors and is thicker than the gate insulating layer of the third pair of MIS transistors.

An advantage of the present invention is that a smaller memory cell may be fabricated and higher density SRAMs can be made.

Another advantage of the present invention is that by fabricating transfer transistors 90 and 92 on top of transistors 82, 84, 86, and 88 by using a insulating layer, no chip surface area was required, and a major reduction in the size of the chip is made possible.

Another advantage of the present invention is that by making an intervening insulating layer that contacts the channel portions of the transistors 82 and 84, and the transfer transistors 90 and 92, the insulating layer is thicker than the gate insulating layer, thus eliminating an issue concerning the breakdown voltage. The thick insulating layer also reduces the leakage current between the source and the drain.

A further advantage of the present invention is that gate electrodes are self-aligned with the source, drain and channel portions of the data input-output transfer transistors 90 and 92.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

FIG. 1 is a schematic diagram of a prior art CMIS static memory cell;

FIG. 2 is a elevational view of the fabricated CMIS memory cell of FIG. 1;

FIG. 3 is a cross-sectional view of the fabricated memory cell of FIG. 1 taken along the line 3—3 in FIG. 2;

FIG. 4 is a schematic diagram of a CMIS static memory cell of the present invention;

FIG. 5 is a elevational view of the fabricated CMIS static memory cell of FIG. 4;

FIG. 6 is a cross-sectional view of the fabricated CMIS static memory cell of FIG. 4 taken along the line 6—6 in FIG. 5;

FIG. 7 is a elevational view of an alternative way to fabricate the static memory cell of FIG. 4; and FIG. 8 is a cross-sectional view of the alternative way to fabricate the CMOS static memory cell of FIG. 4 taken along the line 8—8 in FIG. 7.

DESCRIPTION OF THE PREFERRED EMBODIMENTS

FIG. 4 illustrates an SRAM memory cell 80 of the present invention constructed of a plurality of MIS transistors 82, 84, 86, 88, 90, and 92. Transistors 82 and 86 form a pull-up/pull-down pair cross-connected with another pair, transistors 84 and 88. The cross-connection makes circuit 80 bistable. Such a configuration is a flip-flop. Transistors 90 and 92 are enabled by word line (WL). When WL is high, bit line (BL) and bit line not (/BL) are coupled through respectively by transistors 90 and 92. If a signal point 94 is low, a signal point 96 will be high, and vice versa. Similarly if BL is high, then /BL will be low, and vice versa. If BL matches the state of point 94 when WL goes high, circuit 80 will not flip-flop. But if BL is the opposite of the state of point 94 when WL goes high, circuit 80 will flip-flop. (The same is true for /BL and point 96.) Note that the body terminal of all the N channel type MIS transistors (90 and 92) are not connected to $V_{ss}$ line (ground or negative supply). In the case of transistors 90 and 92, a signal could be developed between the source and the body that will cause a condition known as "body-effect" if the body terminals were connected to $V_{ss}$ line. Elimination of the common body (substrate) results from the way circuit 80, and especially the way transistors 90 and 92 are fabricated.

FIGS. 5-6 illustrate the process of fabrication used to implement circuit 80. For the sake of clarity, only one cross-section through transistors 82, 86, and 90 is discussed (taken at line 6—6). Transistors 84, 88, and 92 are similarly fabricated, except to the extent that the interconnect of the schematic of FIG. 4 must be satisfied. A P-type substrate 100 or a P− well in substrate 100 has a pair of N+ regions 101 and 103 that are used to form various parts of transistor 86. A gate insulating layer 150 insulates the gate of transistor 86 from a first layer of N+ polycrystalline silicon layer 106 acting as a gate electrode. A gate insulating layer 153 insulates the gate of transistor 90 from a fourth layer of N+ polycrystalline silicon layer 113 acting as a gate electrode. A insulating layer 152 is placed between a third layer of P+ and N− polycrystalline silicon thin film (comprising films 108, 109, and 111) and the fourth layer of N+ polycrystalline silicon thin film 113. The insulating layer 152 is fabricated of impurity-free silicon oxide and is thicker than a gate insulating layer 151 associated with transistors 82. Low leakage current results from layer 152 being substantially free of impurities. Gate insulating layer 151 insulates the gate of transistor 82 which uses the first layer of N+ polycrystalline silicon thin film 106 as a gate electrode. Layer 153 is a gate insulating layer for transistor 90 and it uses layer 113. A thick insulating layer 154 is placed between a fifth layer of N+ and P− polycrystalline silicon films 114, 116, and 118 and an aluminum interconnect layer 120. Insulating layer 154 is fabricated of silicon oxide and is thicker than the gate electrode layer 153. Layer 154 is substantially free of impurities.

The source, drain, and gate of transistor 86 respectively comprise the N+ region 101, the N+ region 103, and the layer of N+ polycrystalline silicon thin film 106. The channel of transistor 86 is fabricated on a portion of the surface of the P− monocrystalline silicon substrate 100 local to the respective gate electrode (adjacent to layer 150). The source, drain, and gate of transistor 82 comprise the P+ region 108, a P+ region 111, and a part of the layer of N+ polycrystalline silicon thin film 106. The channel for transistor 82 is fabricated on a portion of the layer of N− polycrystalline silicon thin film 109 that is local to the respective gate electrode. The source, drain, and gate of the N− channel transistor 90 comprise adjacent portions of the layer of N+ polycrystalline silicon thin film 114, the layer of N+ polycrystalline silicon thin film 118, and the layer of N+ polycrystalline silicon thin film 113. The channel for transistor 90 comprises a portion of the layer of P− polycrystalline silicon thin film 116 that is local to the respective gate electrode. (Since the gate is buried under the related channel, transistor 90 is, in effect, upside down.)

The interconnect for $V_{ss}$ (ground) is comprised of a layer of N+ polycrystalline silicon thin film 105. An interconnect for $V_{dd}$ (positive supply) is fabricated parallel to the $V_{ss}$ interconnect film 105 and on top of the layer of P+ polycrystalline silicon thin film 108 and is one piece with the source electrodes of transistors 82 and 84. The word line (WL) interconnect is actually layer 113, and is fabricated parallel to the $V_{ss}$ interconnect 105 and on the layer of N+ polycrystalline silicon thin film 113 in one piece with the gate electrode of the N channel transistors 90 and 92. A pair of interconnects for bit lines BL and /BL, are fabricated right-angles to the $V_{ss}$ interconnect 105, the word line interconnect 113, and the aluminum interconnect layer 120. Aluminum interconnect layer 120 is electrically connected to contact holes 138 and 139.

FIGS. 7-8 illustrate an alternative way to fabricate circuit 80 and is referred to as circuit 80' (because even though the device fabrication is very different, the electrical circuit is the same). A P− monocrystalline silicon substrate 200 (or alternatively a p-well in the substrate 200) comprises a P-well fabricated on an N monocrystalline silicon substrate. A plurality of N+ regions 201-204 are fabricated on the surface of the substrate 200. A first layer of N+ polycrystalline silicon thin films 205 and 206 are fabricated on the surface of substrate 200 through a insulating layer. A second layer of N+ polycrystalline silicon thin film 207 is, in part, fabricated over the first layer of thin films 205 and 206 using a insulating layer. A third layer of P+ and N polycrystalline silicon thin films 208-212 are fabricated over the thin film 207 and are insulated from it by a insulating layer.

A fourth layer of N+ and P− polycrystalline silicon thin films 213-218 are fabricated on thin films 208-212 through the insulating layer. A fifth layer of N+ polycrystalline silicon thin film 219 is fabricated over thin film 213-218 through the insulating layer. A pair of buried contacts 230 and 231 electrically connect N+ regions 201 and 202 to thin film 205. A buried contact 232 electrically connects N+ region 203 with thin film 207. A buried contact 233 electrically connects N+ region 204 with thin film 206. A contact hole 234 electrically connects thin film 207 and thin film 211. A contact hole 235 electrically connects thin film 206 with thin film 212. A pair of contact holes 236 and 237 (formed, in part, over contact holes 234 and 235) are electrically connects thin-films 211 and 212 to thin-films 213 and 214. A pair of contact holes 238 and 239 electrically connect thin films 217 and 218, thin film 205, and thin film 208 to an aluminum interconnect layer 220. Although not shown in FIG. 7, layer 220 is fabricated over the fifth layer of N+ polycrystalline silicon thin film 219 using a insulating layer 254.

A gate insulating layer 250, associated with transistors 86 and 88, insulates the gate electrodes formed by the first and second layers of N+ polycrystalline silicon thin film 206 and 207, respectively. Similarly, a gate insulating layer 251, associated with transistors 82 and 84, insulates the gate electrodes formed by the first and second thin films 206 and 207, respectively. A insulating layer film 252 is formed in between thin films 208–212 and thin films 213–218. Insulating layer film 252 is thicker than the gate insulating layer 251 (associated with transistors 82 and 84), and comprises substantially impurity-free silicon oxide. A gate insulating layer 253 insulates thin film 219 which is used as a gate electrode for transistors 90 and 92. A insulating layer film 254 separates thin film 219 from the aluminum interconnect layer 220. The first and second layers of polycrystalline silicon 206 and 207 are stacked between insulating layer films to achieve the necessary cross-connection between inverters.

Transistors 86 and 88 have their channels fabricated on the surface of substrate 200. The source, drain and gate of transistor 86 are N+ region 201, N+ region 203, and the first layer of N+ polycrystalline silicon thin film 206. The source, drain and gate of transistor 88 are N+ region 202, N+ region 204, and the second layer of N+ polycrystalline silicon thin film 207. Transistors 82 and 84 have their channels fabricated on the third layers of N− polycrystalline silicon thin films 209 and 210. The source, drain and gate of transistor 82 are P+ region 208, P+ region 211, and the first layer of N+ polycrystalline silicon thin film 206. The source, drain and gate of transistor 84 are thin film 208, thin film 212, and the second layer of N+ polycrystalline silicon thin film 207. Transistors 90 and 92 have their channels fabricated on the fourth layer of P− polycrystalline silicon thin films 215 and 216. The source (or drain), drain (or source) and gate of the transfer N channel transistor 90 are thin film 213, thin film 217, and the fifth layer of N+ polycrystalline silicon thin film 219. The source (or drain), drain (or source) and gate of the transfer N channel transistor 92 are thin film 214, thin film 218, and the fifth layer of N+ polycrystalline silicon thin film 219.

The first layer of N+ polycrystalline silicon thin film 205 is used for $V_{ss}$. The third layer of P+ polycrystalline silicon thin film 208 is used for $V_{dd}$ and is fabricated parallel to $V_{ss}$ and is shared as the source electrode of transistors 82 and 84. The interconnect for the word line (WL) is the fifth layer of N+ polycrystalline silicon thin film 219, and is fabricated parallel to $V_{ss}$ interconnect 205 and is shared as the gate electrode of transistors 90 and 92. The bit line interconnects BL and /BL, are fabricated right-angles to $V_{ss}$ interconnect 205 and WL. Bit line interconnects BL and /BL connect to the aluminum interconnect layer via contact holes 238 and 239.

With reference to FIGS. 4, 7, and 8, a major advantage of the present invention is realized because the channels of transistors 90 and 92 are not fabricated on the surface of the P− monocrystalline silicon substrate 200. By fabricating the channels on the fourth layer of P− polycrystalline silicon thin films 215 and 216 on top of transistors 86 and 88 or on top of transistors 82 and 84, the degree of misregistration of transistors 90 and 92 will be less than that obtained by fabricating them directly on substrate 200. Wider channel widths, and therefore higher betas can be obtained, because there is now enough room. The leakage current between the source and drain of transistors 82 and 84 and transistors 90 and 92 is very much improved over a configuration in which the gate electrode 219 is fabricated on the third layer of P+ and N− polycrystalline silicon thin films 208–212. This is due, in part, to the fact that the channels of transistors 82 and 84 and the channels of transistors 90 and 92 oppose each other. These are separated by an insulating layer film that is thicker than the gate insulating layer 251 of transistors 82 and 84 and the gate insulating layer 253 of transistors 90 and 92. Insulating layer film 252 is made of substantially impurity-free silicon oxide. The leakage current between the source and the drain of the transistors 82 and 84 and the transistors 90 and 92 can be further reduced by not fabricating an N or a P region on the third layer of N− polycrystalline silicon thin films 209 and 210 or the fourth layer of P− polycrystalline silicon thin films 215 and 216 (which are the channel locations).

Alternatively, a polycide layer of thin film may be used instead of the N+ polycrystalline silicon thin film used in the first, second and fifth layers, in conformance with the present invention. Alternatively, a layer of P+ or N− monocrystalline silicon thin film may be used instead of the layer of P+ and N− polycrystalline silicon thin film which is used in the third layer, in conformance with the present invention. The channels discussed above, may alternatively be made of a layer of single-crystal silicon, and the source and drain may be made of a layer of either a single-crystal silicon thin film or a polycrystalline silicon thin film. A still further alternative substitutes the layer of N+ and P− polycrystalline silicon thin film used in the fifth layer with a layer of N+ and P− monocrystalline silicon thin film. In an alternative embodiment, the channels may be made of a layer of single-crystal silicon, and the source and the drain may be made of a layer of either a single-crystal silicon or a polycrystalline silicon thin film. The channels of transistors 82, 84, 90, and 92 may be fabricated of an undoped, intrinsic silicon and the source and drain may be fabricated of a non-intrinsic silicon. There are no limitations on the semiconductor materials to be used. In the above exemplary embodiment, an N channel MIS transistor was used as transfer MIS transistors 90 and 92. However, the same functionality can be obtained by using a P channel MIS transistor. Insulating layer films 252 and 254 are not limited to a single layer type of fabrication.

While the invention has been described in conjunction with several specific embodiments, it will be evident to those skilled in the art that many further alternatives, modifications and variations are possible in light of the foregoing description. The invention described herein is intended to embrace all such alternatives, modifications, applications and variations as may fall within the spirit and scope of the appended claims.

What is claimed is:

1. A semiconductor integrated circuit with a substrate, comprising:
   a first inverter having a drive MIS transistor, a load device, and a transfer MIS transistor able to communicate an output of the first inverter to a data line, the drive and transfer MIS transistors each having a gate, a source, and a drain electrode, the channel of the drive MIS transistor being formed in a portion of the surface of the substrate, the load device comprising a first silicon layer deposited on an insulating layer on the semiconductor substrate, and such that the channel of the transfer MIS transistor is a part of a second silicon layer which is deposited on an insulating layer on the first silicon layer, wherein a first region of the second silicon layer is electrically connected to the output of the first inverter and a second region of the second silicon layer is connected to the data line;
   a first interconnect layer forms the gate electrode of the transfer MIS transistor and is sandwiched between insulating layers and is disposed between the first and second silicon layers; and
   the insulating layer between the first interconnect layer and the first silicon layer is thicker than the insulating layer between the first interconnect layer and the second silicon layer.

2. A semiconductor integrated circuit with a substrate, comprising:
   a first inverter having a drive MIS transistor, a load device, and a transfer MIS transistor able to communicate an output of the first inverter to a data line, the drive and transfer MIS transistors each having a gate, a source, and a drain electrode, the channel of the drive MIS transistor being formed in a portion of the surface of the substrate, the load device comprising a first silicon layer deposited on an insulating layer on the semiconductor substrate, and such that the channel of the transfer MIS transistor is a part of a second silicon layer which is deposited on an insulating layer on the first silicon layer, wherein a first region of the second silicon layer is electrically connected to the output of the first inverter and a second region of the second silicon layer is connected to the data line;
   a first interconnect layer forms the gate electrode of the transfer MIS transistor and is sandwiched between insulating layers and disposed between the first and second silicon layers;
   the insulating layer between the first interconnect layer and the first silicon layer is made of silicon oxide which is substantially free of impurities; and
   the insulating layer between the first interconnect layer and the first silicon layer is made of silicon oxide which is substantially free of impurities.

3. The semiconductor integrated circuit of claim 2, wherein:
   the insulating layer between the first interconnect layer and the second silicon layer is made of silicon oxide that is substantially free of impurities.

4. The semiconductor integrated circuit of claim 2, wherein:
   the insulating layer between the first silicon layer and the first interconnect layer is thicker than the insulating layer between the first interconnect layer and the second silicon layer.

5. A semiconductor integrated circuit with a substrate, comprising:
   a first inverter having a drive MIS transistor, a load device, and a transfer MIS transistor able to communicate an output of the first inverter to a data line, the drive and transfer MIS transistors each having a gate, a source, and a drain electrode, the channel of the drive MIS transistor being formed in a portion of the surface of the substrate, the load device comprising a first silicon layer deposited on an insulating layer on the semiconductor substrate, and such that the channel of the transfer MIS transistor is a part of a second silicon layer which is deposited on an insulating layer on the first silicon layer, wherein a first region of the second silicon layer is electrically connected to the output of the first inverter and a second region of the second silicon layer is connected to the data line; and
   the first layer of silicon is formed on an insulating layer that covers the gate electrode of the drive MIS transistor.

6. A semiconductor integrated circuit with a substrate, comprising:
   a first inverter having a drive MIS transistor, a load device, and a transfer MIS transistor able to communicate an output of the first inverter to a data line, the drive and transfer MIS transistors each having a gate, a source, and a drain electrode, the channel of the drive MIS transistor being formed in a portion of the surface of the substrate, the load device comprising a first silicon layer deposited on an insulating layer on the semiconductor substrate, and such that the channel of the transfer MIS transistor is a part of a second silicon layer which is deposited on an insulating layer on the first silicon layer, wherein a first region of the second silicon layer is electrically connected to the output of the first inverter and a second region of the second silicon layer is connected to the data line;

7. The semiconductor integrated circuit of claim 6, wherein:
   the insulating layer between the first and second layers comprises an insulating silicone compound.

8. The semiconductor integrated circuit of claim 6, wherein:
   the load MIS transistor and the drive MIS transistor have a common gate electrode.

9. The semiconductor integrated circuit of claim 8, wherein:
   the insulating layer between the first silicon layer and the gate electrode of the drive MIS transistor and load MIS transistor is thicker than the insulating layer between the first silicon layer and the second silicon layer.

10. The semiconductor integrated circuit of claim 8, wherein:
    a third silicon layer comprises the gate electrode of the transfer MIS transistor and is located between the first and second silicon layers; and
    a first insulating layer is located between the first and third layers of silicon and is thicker than a second insulating layer located between the first silicon layer and the gate electrode of the drive and load MIS transistors, the first insulating layer also being thicker than a third insulating layer which is located between the second and third silicon layers.

11. The semiconductor integrated circuit of claim 10, wherein:

the insulating layer between the first and third silicon layer is formed of silicon oxide that contains almost no impurities.

12. The semiconductor integrated circuit of claim 5, wherein:
   a local region of the first silicon layer forms the drain of the load MIS transistor and is electrically connected to a drain diffusion region of the drive MIS transistor through a first contact hole; and
   a local region of the second layer of silicon forms the drain or source of the transfer MIS transistor is electrically connected to the first silicon layer through a second contact hole.

13. The semiconductor integrated circuit of claim 5, wherein:
   the data line is in contact with the second silicon layer through a third contact hole formed above a part of a source diffusion region of the drive MIS transistor.

14. The semiconductor integrated circuit of claim 13, wherein:
   the third contact hole is formed above a part of the first layer of silicon.

15. The semiconductor integrated circuit of claim 5, wherein:
   the drive MIS transistor is n-type and the load MIS transistor p-type.

16. The semiconductor integrated circuit of claim 15, further comprising:
   a second inverter similar to the first inverter and located in a region adjacent to the first inverter, the first and second inverters are connected to form a first bistable circuit.

17. The semiconductor integrated circuit of claim 16, further including:
   a plurality of bistable circuits similar to the first bistable circuit, the plurality of bistable circuits organized and interconnected to forms an SRAM memory device.

18. A flip-flop fabricated within a semiconductor device having a substrate, comprising:
   a first MIS transistor with a first channel positioned on a surface of the substrate or the well in the substrate, the first MIS transistor having a first gate electrode separated from the first channel by a first insulating layer;
   a second MIS transistor that shares the first gate electrode of the first MIS transistor to form a second gate electrode, the second MIS transistor fabricated by depositing a first layer of silicon film over a second insulating layer such that a second channel and associated drain and source electrodes are formed with the second channel over the first MIS transistor;
   a third MIS transistor formed over the second MIS transistor, the third MIS transistor having a third gate electrode separated from its channel by third insulating layer, the third MIS transistor having a third channel and associated drain and source electrodes that are formed with the third channel, the third MIS transistor having its drain or source electrically connected with the drain of the first MIS transistor and the drain of the second MIS transistor, the source or drain of the third MIS transistor connected to a data line for transferring data into and out of the flip-flop, the third gate electrode connected to a control line for controlling the transfer of data into and out of the flip-flop;
   a fourth MIS transistor with a fourth channel positioned on a surface of the substrate or the well in the substrate, the fourth MIS transistor having a fourth gate electrode separated from the fourth channel by the first insulating layer;
   a fifth MIS transistor that shares the fourth gate electrode of the fourth MIS transistor to form a fifth gate electrode, the fourth and fifth gate electrodes connected to the drains of the first transistor, the drain or source of third transistor and the drain of the second MIS transistor, the fifth MIS transistor fabricated by depositing the first layer of silicon film over the second insulating layer such that a fifth channel and associated drain and source electrodes are formed with the fifth channel over the fourth MIS transistor; and
   a sixth MIS transistor formed over the fifth MIS transistor, the sixth MIS transistor having a sixth gate electrode separated from its channel by the third insulating layer, and the sixth MIS transistor having a sixth channel and associated drain and source electrodes that are formed with the sixth channel, the sixth MIS transistor having its drain or source electrically connected with the drain of the fourth MIS transistor and the drain of the fifth MIS transistor and the first and second gate electrodes, the source or drain of the sixth MIS transistor connected to another data line for transferring inverted data into and out of the flip-flop, the sixth gate electrode connected to the control line.

19. A static random access memory (SRAM) device having a plurality of flip-flops fabricated within a single semiconductor device having a substrate, the SRAM having a word line, true bit line and complementary bit line, the plurality of flip-flops each comprising:
   a first MIS transistor with a first channel positioned on a surface of the substrate or the well in the substrate, the first MIS transistor having a first gate electrode separated from the first channel by a first insulating layer;
   a second MIS transistor that shares the first gate electrode of the first MIS transistor to form a second gate electrode, the second MIS transistor fabricated by depositing a first layer of silicon film over a second insulating layer such that a second channel and associated drain and source electrodes are formed with the second channel over the first MIS transistor;
   a third MIS transistor formed over the second MIS transistor, the third MIS transistor having a third gate electrode separated from its channel by a third insulating layer, the third MIS transistor having a third channel and associated drain and source electrodes that are formed with the third channel, the third MIS transistor having its drain or source electrically connected with the drain of the first MIS transistor and the drain of the second MIS transistor, the source or drain of the third MIS transistor connected to the true bit line, the third gate electrode connected to the word line;
   a fourth MIS transistor with a fourth channel positioned on a surface of the substrate or the well in the substrate, the fourth MIS transistor having a fourth gate electrode separated from the fourth channel by the first insulating layer;
   a fifth MIS transistor that shares the fourth gate electrode of the fourth MIS transistor to form a fifth gate electrode, the fourth and fifth gate electrodes connected to the drains of the first transistor, the drain or source of third transistor and the drain of the second MIS transistor, the fifth MIS transistor fabricated by depositing the first layer of silicon film over the second insulating layer such that a fifth channel and associated drain and source electrodes are formed with the fifth channel over the fourth MIS transistor; and a sixth MIS transistor formed over the fifth MIS transistor, the sixth MIS transistor having a sixth gate electrode separated from its channel by the third insulating layer, and the sixth MIS transistor having a sixth channel and associated drain and source electrodes that are formed with the sixth channel, the sixth MIS transistor having its drain or source electrically connected with the drain of the fourth MIS transistor and the drain of the fifth MIS transistor and the first and second gate electrodes, the source or drain of the sixth MIS transistor connected to the complimentary bit line, the sixth gate electrode connected to the word line.

20. A semiconductor integrated circuit having static memory cells comprising:

a first pair of MIS transistors with channels fabricated on a surface of a semiconductor substrate; and a second and third pair of MIS transistors with their respective channels fabricated on a layer of semiconductor thin film formed on an insulating layer, the third pair of MIS transistors are fabricated on the second pair of MIS transistors on a first insulating layer such that a portion of the first insulating layer that makes contact with the channels of the second or third pair of MIS transistors is thicker than the gate insulating layer of the second and third pair of MIS transistors, and has an interconnect for a pair of MIS transistors using a second insulating layer that makes contact with channels of the third pair of MIS transistors and is thicker than the gate insulating layer of the third pair of MIS transistors.

21. The semiconductor integrated circuit of claim 20, wherein:

the first and third pair of MIS transistors have channels comprising a semiconductor material having a conductivity type opposite to the semiconductor material comprising the channels of the second pair of MIS transistors.

22. The semiconductor integrated circuit of claim 21, wherein:

the first pair of MIS transistors and the third pair of MIS transistors are n-type and the second pair of MIS transistors are p-type.

23. The semiconductor integrated circuit of claim 20, wherein:

the first pair of MIS transistors have channels comprising a semiconductor type opposite to that used for the second and third pairs of MIS transistors.

24. The semiconductor integrated circuit of claim 23, wherein:

the first pair of MIS transistors are n-type and the second and third pairs of MIS transistors are p-type.

25. The semiconductor integrated circuit of claim 20, wherein:

the semiconductor thin film comprises a layer of polycrystalline silicon thin film.

26. The semiconductor integrated circuit of claim 20, wherein:

the first and second dielectric layers, which contact at least a portion of the channels of either the first or third pairs of MIS transistors are comprised of silicon dioxide that is substantially free of impurities.

* * * * *